United States Patent [19]

Kolanko et al.

[11] Patent Number: 5,578,950
[45] Date of Patent: Nov. 26, 1996

[54] LOW VOLTAGE INDICATOR WITH A SELF-BIASED DRIVER CIRCUIT

[75] Inventors: Frank J. Kolanko, Greenville; Jay D. Moser, Sr., Hope, both of R.I.

[73] Assignee: Cherry Semiconductor Corporation, East Greenwich, R.I.

[21] Appl. No.: 272,257

[22] Filed: Jul. 8, 1994

[51] Int. Cl.⁶ .................... H03K 17/18; H03K 17/615
[52] U.S. Cl. ................ 327/110; 327/80; 327/482; 327/483; 327/484; 340/660
[58] Field of Search ................ 327/110, 108, 327/575, 483, 142, 143, 198, 327, 432, 482, 484, 543, 544, 80, 87, 478, 481, 485, 77, 78, 489; 340/663, 661, 660, 657, 641, 428

[56] References Cited

U.S. PATENT DOCUMENTS

| | | | |
|---|---|---|---|
| 4,056,765 | 11/1977 | Scheidler et al. | 340/663 |
| 4,574,221 | 3/1986 | Hess et al. | 327/575 |
| 4,574,276 | 3/1986 | Sato | 340/663 |
| 4,616,144 | 10/1986 | Hideshima et al. | 327/575 |
| 4,947,055 | 8/1990 | Shekhawat et al. | 327/483 |
| 4,980,578 | 12/1990 | Shaffer et al. | 327/432 |
| 5,047,662 | 9/1991 | Edwards | 327/108 |

*Primary Examiner*—Timothy P. Callahan
*Assistant Examiner*—Terry L. Englund
*Attorney, Agent, or Firm*—Robert M. Asher

[57] ABSTRACT

A low voltage indicator circuit including a self-biased driver circuit. A voltage at the output terminal is used to create a bias voltage to operate the driver when less than a threshold voltage is present on at least one voltage supply line. A transistor for supplying base drive current to the driver has a base coupled to the at least one voltage supply line in one embodiment and to the bias circuit in other embodiments. The transistor in the one embodiment provides base drive current to the driver when voltage on the at least one voltage supply line is less than the voltage on the output terminal by at least a predetermined amount. In other embodiments, the bias circuit may include a FET or resistor coupled between the output terminal and the base of a bias circuit transistor. The bias circuit transistor has a terminal connected to a bias resistor for providing current through the bias resistor when the bias circuit transistor is turned on. A switch connected to the base of the bias circuit transistor selectively directs the current from the FET or resistor to or away from the base of the bias circuit transistor. Current is directed to the base of the bias circuit transistor when less than a threshold voltage is present on the at least one voltage supply line. This causes current to flow through the bias resistor developing a bias voltage thereacross.

18 Claims, 3 Drawing Sheets

5,578,950

LOW VOLTAGE INDICATOR WITH A SELF-BIASED DRIVER CIRCUIT

BACKGROUND OF THE INVENTION

The present invention relates to a driver circuit for driving current for use by a device such as an indicator lamp. In particular, the driver circuit is self-biased to permit driving an output current when supply voltage to the circuit is off.

In a safety system such as an airbag for an automobile, it is desirable to provide an indicator lamp to signal when a problem exists with the safety system. Typically, a circuit with control logic will light the indicator lamp when a problem is detected. Unfortunately, such a circuit generally performs only if a supply voltage is being applied to the driver circuit itself.

SUMMARY OF THE INVENTION

The present invention is directed to a self-biased driver circuit. A driver is connected to an output terminal. A first transistor has one terminal coupled to the output terminal and a second terminal coupled to the driver. The base of the first transistor is switched off when a sufficient voltage is present on the supply line of the circuit. When a sufficient voltage is not present on the circuit supply line, the first transistor can be turned on by a voltage on the output terminal. A current is thus created through the second terminal of the first transistor to turn on the driver. The self-biased driver circuit of the present invention can thus be used to turn on an indicator lamp when the supply to the driver circuit is not on. In the case of an airbag indicator lamp, the voltage is provided at the output terminal by the car battery connected to the indicator lamp through the ignition switch.

One embodiment of the invention for self-biasing a driver circuit provides a resistor between the output terminal and a transistor. An FET for supplying a current is connected between the output terminal and the base of that transistor. A switch is connected between the base of the transistor and ground. The switch may direct current from the FET to or away from the base of the transistor. The switch is turned on to shut off the transistor when voltage is present on the supply line of the driver circuit. The current drawn by the FET is small such that it is insufficient to light an indicator lamp. When there is no voltage on the supply to the driver circuit, the transistor is allowed to operate by the switch and current provided by the FET turns on the transistor which pulls a current through the resistor which in turn turns on the driver.

In accordance with a further embodiment of the invention, the FET is replaced with a resistor.

In accordance with a still further embodiment of the invention, the first transistor is connected to the output terminal and the driver. The transistor can be turned on by a resistor having one end connected to the base of the transistor, and a second end coupled to the circuit supply line and also connected to the path to ground. Drive current is provided by the resistor to the first transistor when the voltage on the circuit supply line is less than a voltage on the output terminal by at least a predetermined amount.

The present invention can advantageously be used to light an indicator lamp or sound an alarm buzzer when the circuit supply voltage is off. The driver circuit is advantageously self-biased by the battery voltage applied to the lamp or buzzer at the output terminal of the driver circuit.

Other objects and advantages of the present invention will become apparent during the following description of the presently preferred embodiments of the invention taken in conjunction with the drawings.

DETAILED DESCRIPTION OF THE PREFERRED EMBODIMENTS

Figure 1:
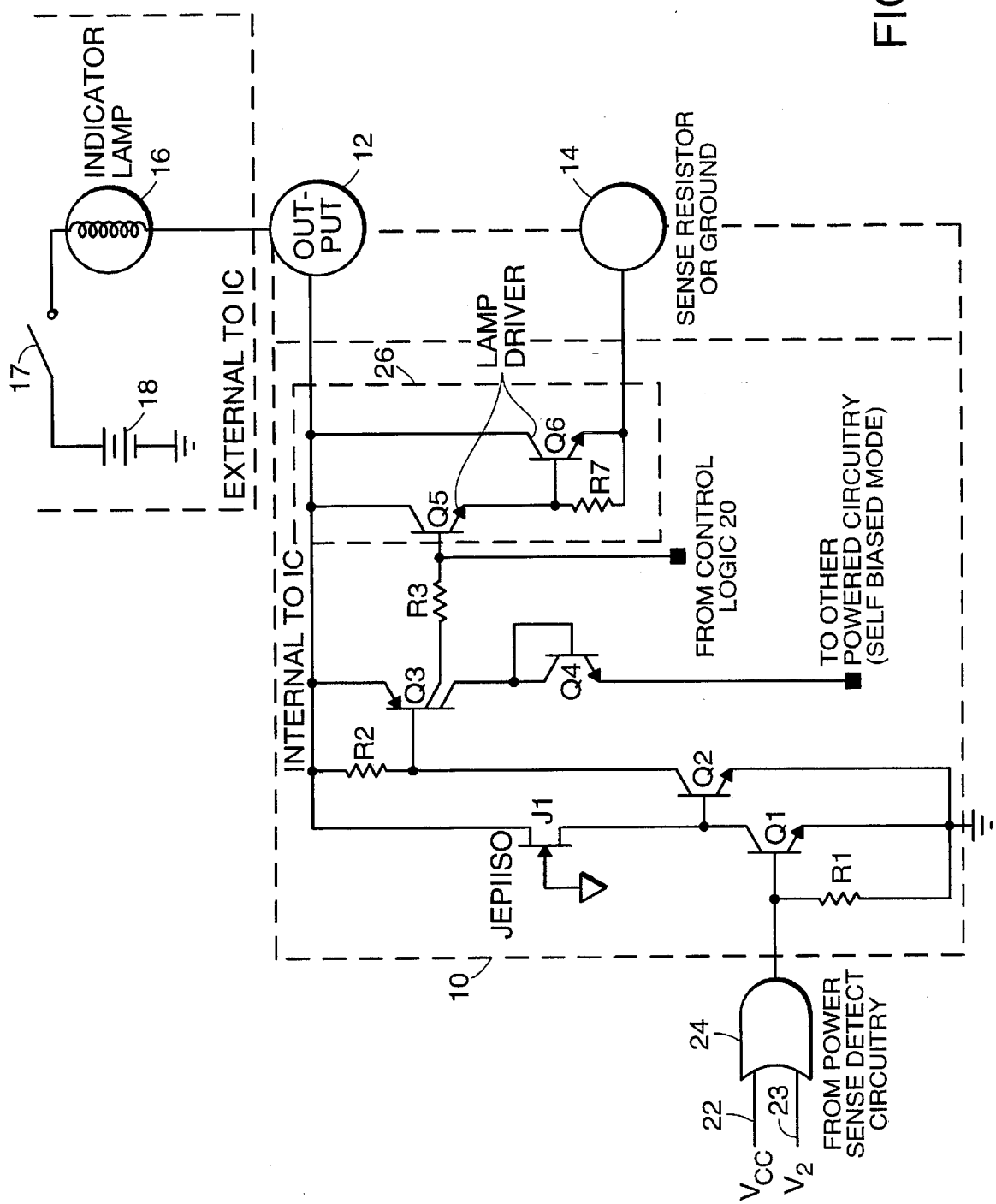
FIG. 1 is a circuit schematic of a first embodiment of the present invention.

FIG. 1 is a schematic diagram of a presently preferred embodiment of the invention. The self-biased driver circuit 10 is a portion of a larger integrated circuit device. Two terminals of the circuit device are shown connected to the self-biased driver circuit 10. These include an output terminal 12 and a ground terminal 14. The ground terminal 14 may alternatively be used as a sense terminal for connection to ground through a sense resistor depending on the application. The self-biased driver circuit of the present invention is configured for bottom side driving of a device such as a lamp or buzzer. The application shown in FIG. 1 is for use on an automobile airbag indicator lamp. The indicator lamp 16 may be used on the dashboard of an automobile for indicating when there may be a problem with the airbag system. The automobile car battery 18 is connected to the indicator lamp 16 by the ignition switch 17.

The integrated circuit device in which the self-biased driver circuit is incorporated also includes a supply terminal Vcc (not shown). Typically a regulated voltage is applied to the supply terminal to provide the power and voltage signal necessary for running the integrated circuit device. The self-biased driver circuit is coupled to the supply line 22 at the base of a switch transistor Q1. Rather than connect to the supply line itself, the base of switch transistor Q1 may be provided with a logic signal indicating whether the supply line has sufficient voltage. In the case where there may be more than one supply to the integrated circuit device, both supply lines 22, 23 may be monitored by a logic circuit such as an OR gate 24 so as to provide a signal to the switch transistor Q1 that indicates whether any of the supply lines 22, 23 are on. The self-biased driver circuit of the present invention has been designed to drive the indicator lamp 16 on when there is no supply voltage or an insufficient supply voltage being applied to the integrated circuit device.

The self-biased driver circuit 10 includes a driver circuit 26. The driver circuit shown includes a pair of Darlington transistors, Q5, Q6. A resistor is connected between the base and the emitter of the second Darlington transistor Q6. This is only one of the many possible drivers that may be operated by the self-biasing method of the invention. Alternative driver circuits include but are not limited to, power MOS transistors, power JFET transistors and DMOS transistors.

Control logic 20 is connected to the base of the first Darlington transistor Q5. The control logic may monitor any number of conditions for which it is desired that the indicator lamp be lit. For example, the control logic 20 may include a timing circuit that turns on the indicator lamp when the ignition switch is first turned on. The lamp may be held on for a certain period of time, enough to allow the driver to know that the lamp is working. Another circuit may monitor the airbag system itself and if a fault is determined, would drive the indicator lamp on through the base of the first Darlington transistor Q5. This control logic would be inoperable if there were no power to the integrated circuit device. The self-biasing method of the present invention is provided to alert the driver to this fault condition in which there is no power to the integrated circuit.

A split collector PNP transistor Q3 has an emitter connected to the output terminal 12. The split collector of transistor Q3 permits additional circuitry to be operated. One of the collectors of the split collector transistor Q3 is coupled to the driver circuit 26 through a resistor R3. Resistor R3 isolates transistor Q3 from the control logic during normal operation. A second collector may be connected to other circuitry that may benefit from operating in a self-biased mode. A transistor Q4 is hooked up as a diode to prevent the other circuitry from affecting the normal operation of the split collector transistor Q3. One example of other powered circuitry that may benefit from self-biasing is a thermal shutdown circuit for turning the driver circuit off if excessive heat is generated by a short circuit, for example.

A resistor R2 is connected to the base of the split collector transistor Q3. The resistor R2 prevents high temperature leakage from turning on the split collector Q3. The other end of the resistor R2 is connected to the emitter of the collector transistor Q3. An FET J1 is connected between the output terminal 12 and the base of a transistor Q2. The gate of the FET is connected to ground. The source of the FET is connected to the output terminal and the drain is connected to the base of transistor Q2. The other terminals of transistor Q2 are arranged to provide current through the resistor R2 when the transistor Q2 is turned on. The emitter of transistor Q2 is connected to ground. The collector of transistor Q2 is connected to the resistor R2. The FET of the embodiment of FIG. 1 is a JFET, in particular an EPIISO FET. The FET provides the operating current for self-biasing at a level that is insufficient to light the indicator lamp 16 by itself. When the ignition is switched on to connect the car battery 18 through the indicator lamp 16, a voltage is made present at the output terminal 12. This voltage applied to the FET produces a current. An FET can be selected that can advantageously act as a constant current source in response to the voltage applied at the output terminal 12. While a JFET is shown in the illustrated embodiment of the invention, any FET may be substituted including but not limited to a PMOS or NMOS.

The current provided by the FET is directed entirely into the base of transistor Q2 if the switch transistor Q1 is off. The switch transistor Q1 is off when there is no voltage or insufficient voltage on the supply lines to the integrated circuit device. The current of the FET J1 is amplified by the beta of transistor Q2. Transistor Q2 applies the amplified current to the base of the split collector transistor Q3. The split collector transistor Q3 provides further current amplification to power up the desired portions of the circuitry. This includes the driver circuit 26 and the other powered circuitry through transistor Q4. The driver circuit 26 is thus powered by the integrated circuit device despite the lack of sufficient supply voltage to the IC device.

When there is sufficient voltage on any of the supply lines of the integrated circuit, the switch transistor Q1 is on. In the on state, the switch transistor Q1 directs all of the current from the FET to ground. A resistor R1 is connected between the base and the emitter of the switch transistor Q1. Resistor R1 prevents high temperature leakage from turning on switch transistor Q1. With the switch transistor Q1 on, the amplifier transistor Q2 is shut off. Thus no current is drawn through resistor R2 and the split collector transistor Q3 is shut off. The self-biasing circuitry is thus inactivated and operation of the driver circuit 26 is left to the control logic 20. The control logic is functional since there is sufficient voltage on at least one of the supply lines to the integrated circuit device. The current drawn by the FET is insufficient to light the indicator lamp 16. The indicator lamp 16 will remain off so long as there is sufficient voltage to the integrated circuit device and the control logic detects no reason to turn the lamp 16 on.

Figure 2:
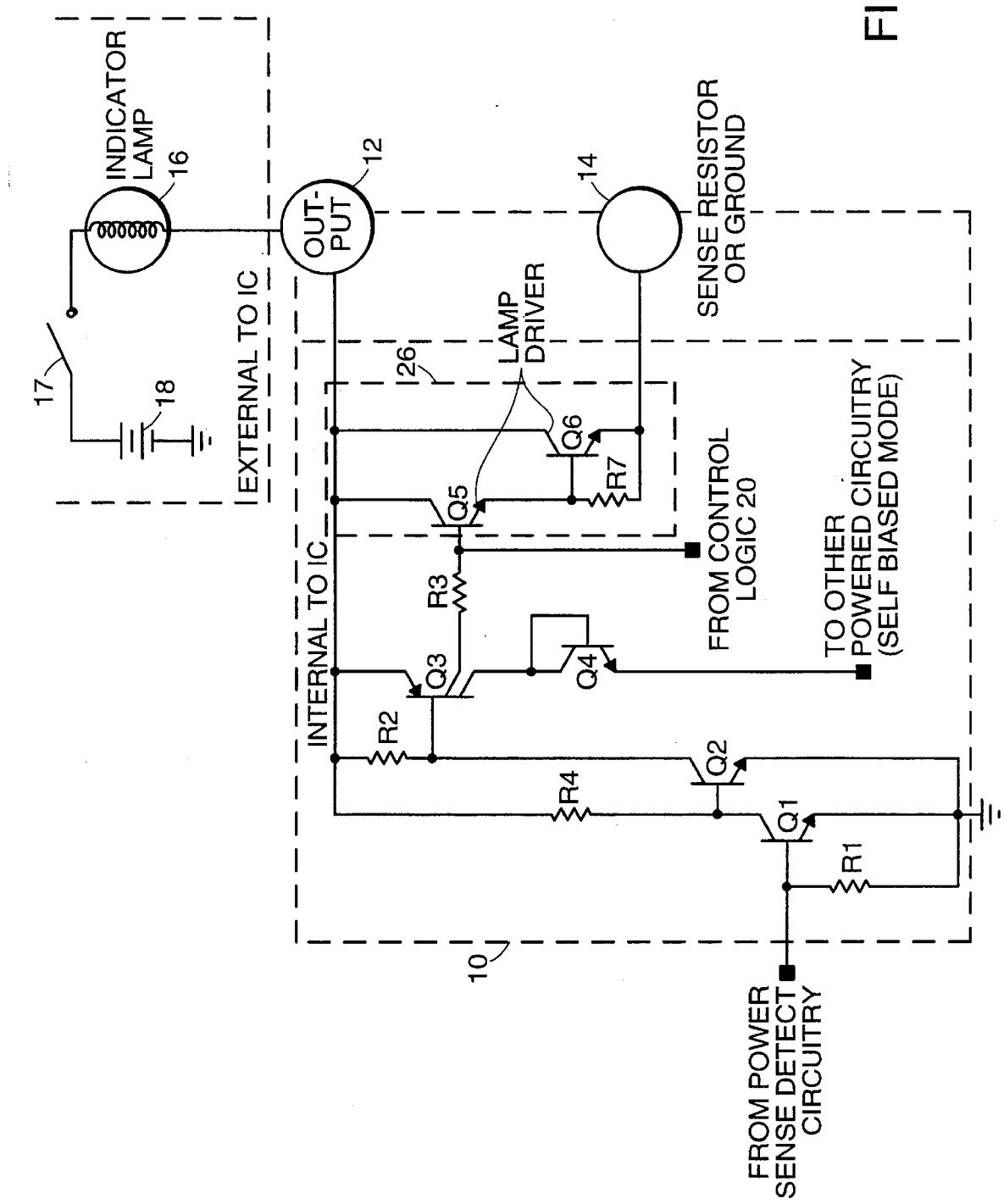
FIG. 2 is a circuit schematic of a second embodiment of the present invention.

Referring now to FIG. 2, an alternate embodiment of the invention is shown. Here, the FET has been replaced by a resistor R4. The value for the resistor R4 is determined by the battery voltage 18 supplied to the indicator lamp 16 and the lamp leakage requirements. The FET has the advantage that it can be configured to act as a supply independent constant current source. The current through resistor R4 is supply dependent, therefore circuits with this design may have a limited useful supply range.

Figure 3:
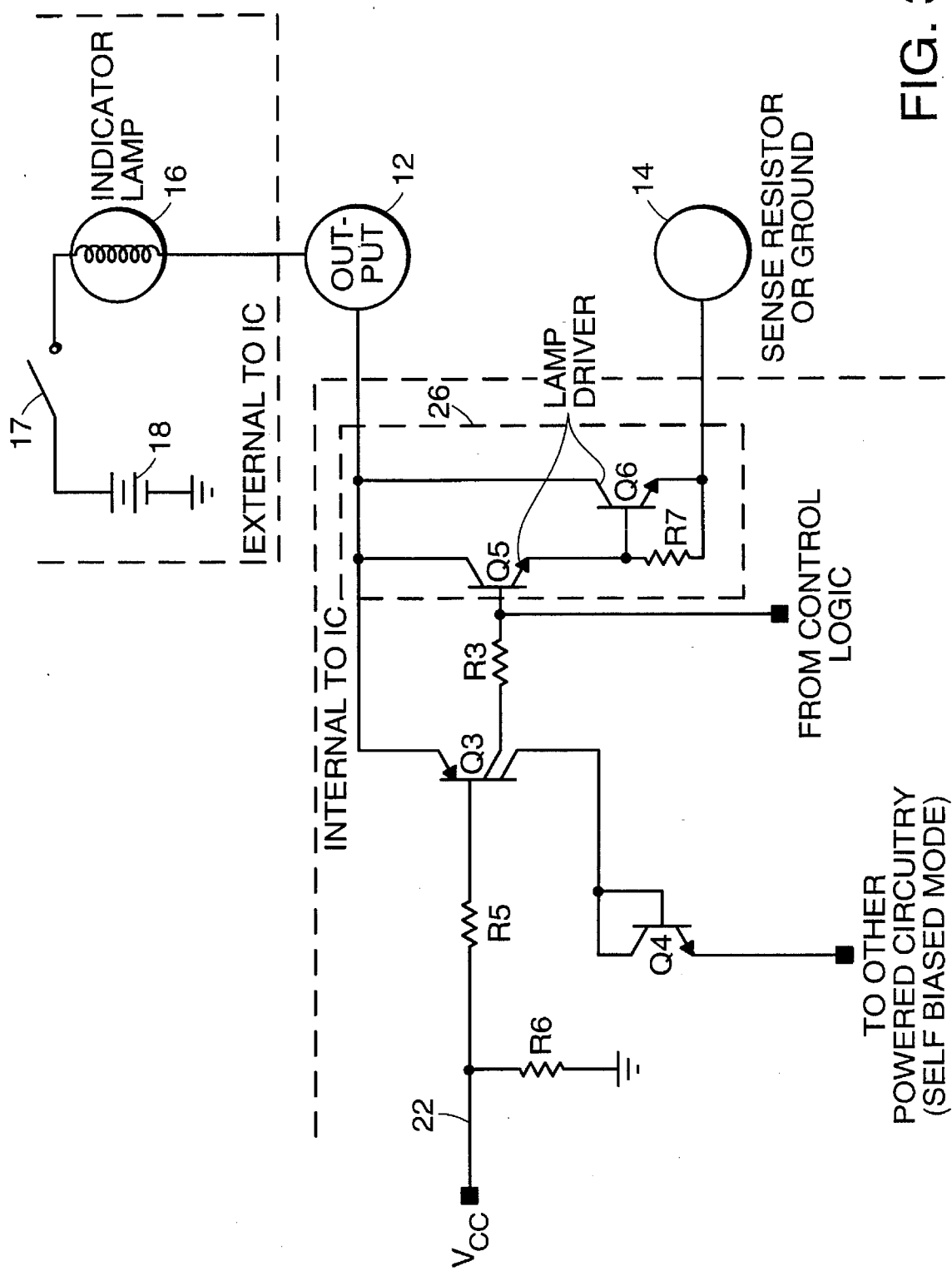
FIG. 3 is a circuit schematic of a third embodiment of the present invention.

Referring now to FIG. 3, another method for turning on the split collector transistor Q3 when there is insufficient supply voltage on the integrated circuit is shown. Here, a resistor R5 is connected between the base of split collector transistor Q3 and the voltage supply line 22 itself. The value of R5 is selected to provide drive current to the split collector transistor Q3 when the supply line is at a voltage less than the voltage at the output terminal 12 by a user predetermined amount. A resistor R6 is connected between the end of the resistor R5 opposite from the split collector transistor Q3 and ground. The resistor R6 is selected to provide a guaranteed path to ground for the resistor R5. Normally when the supply line is off or has an insufficient voltage, there is usually a low enough resistance from the system's overall circuitry to provide current from the battery 18 through the resistor R6 that turns on the split collector transistor Q3 and the driver circuit 26. The resistor R3 functions to isolate the split collector transistor Q3 from the lamp control logic when the supply line is up and running.

When only one of a plurality of supply lines is coupled to the self-biasing circuit, it is necessary for the current generated through the collector of the split collector transistor Q3 through the resistor R3 to be sufficient to drive the driver circuit 26 over and above any current drawn by the control logic. The control logic shouldn't be drawing any current when the power line is off. However, when a second supply line may be powering or partially powering the control logic, it is desirable to have the current from the split collector transistor be sufficient to overcome the possible current draw from the control logic so that the indicator lamp will be turned on when the supply line 22 has an insufficient voltage. Alternatively, if the current is not sufficient to overcome current drawn from the control logic, the self-biased circuit will at least operate to light the lamp when both supply lines to the integrated circuit are off.

Of course, it should be understood that various changes and modifications to the preferred embodiments described above will be apparent to those skilled in the art. For example, the self-biasing circuitry may be activated in response to the absence of any or all of a plurality of supply lines to an integrated circuit. This and other changes can be made without departing from the spirit and scope of the invention and without diminishing its attendant advantages. It is therefore intended that such changes and modifications be covered by the following claims.

We claim:

1. A low voltage indicator circuit comprising:

an output terminal;

a driver connected to said output terminal;

a first transistor having (a) a first terminal coupled to said output terminal, (b) a base, (c) and a second terminal coupled to said driver;

means, coupled between the base of said first transistor and at least one voltage supply line, for holding said first transistor off in response to at least a threshold voltage being present on the at least one voltage supply line; and wherein said first transistor is turned on by a voltage on said output terminal in response to less than the threshold voltage being present on the at least one voltage supply line such that current is provided through the second terminal of said first transistor to turn on said driver.

2. The circuit of claim 1 wherein said driver comprises a Darlington pair of transistors.

3. The circuit of claim 1 wherein said means for holding said first transistor off comprises a resistor connected between the base of said first transistor and said output terminal, a second transistor coupled to said resistor for driving current through said resistor and a switch transistor having a base connected to receive a signal corresponding to the presence or absence of at least the threshold voltage on the at least one voltage supply line and said switch transistor being connected to said second transistor so as to deprive said second transistor of base current when the signal corresponding to the presence of at least the threshold voltage on the at least one voltage supply line is received by the base of said switch transistor.

4. The circuit of claim 3 further comprising a second resistor coupled between said output terminal and said switch transistor to provide current from said output terminal to drive said second transistor when said switch transistor is off because less than the threshold voltage is on the at least one voltage supply line.

5. The circuit of claim 3 further comprising an FET, coupled between said output terminal and said switch transistor, that acts like a constant current source in response to voltage on said output terminal to supply a current, wherein the current from the FET drives said second transistor when said switch transistor is off because less than the threshold voltage is on the at least one voltage supply line.

6. The circuit of claim 5 further comprising an indicator lamp coupled to said output terminal and wherein the current supplied by said FET is insufficient by itself to light the indicator lamp.

7. The circuit of claim 1 wherein said means for holding said first transistor off comprises a resistor having one end connected to the base of said first transistor and a second end coupled to the at least one voltage supply line and also coupled to ground, such that drive current for said first transistor is passed through said resistor when the voltage on the at least one voltage supply line is less than a voltage on the output terminal by at least a predetermined amount.

8. A bias circuit comprising:

an output terminal;

a transistor having a base and a terminal;

a resistor coupled between the terminal of said transistor and said output terminal;

an FET coupled between the base of said transistor and said output terminal and having a gate coupled to ground so that said FET supplies a current in response to voltage on said output terminal; and a switch connected to the base of said transistor for selectively directing the current from said FET to or away from the base of said transistor, such that a bias voltage is developed across said resistor in response to said switch directing current from said FET to the base of said transistor.

9. The circuit of claim 8 further comprising a pnp transistor having an emitter connected to said output terminal, a base connected to said resistor and a collector connected for providing base drive current to a driver.

10. The circuit of claim 8 further comprising means, coupled to said switch, for receiving a supply line voltage signal to cause said switch to direct the current from said FET to the base of said transistor only when the supply line voltage signal is below a threshold.

11. The circuit of claim 8 further comprising a driver having a base and a terminal, the base being responsive to the bias voltage and the terminal being coupled to said output terminal and wherein said driver drives output current through said output terminal when said switch directs the current from said FET to the base of said transistor.

12. The circuit of claim 11 wherein said driver comprises a Darlington pair of transistors.

13. The circuit of claim 11 further comprising an indicator lamp coupled to said output terminal and wherein the current supplied by said FET is insufficient to light the indicator lamp.

14. A low voltage indicator circuit comprising:

a first transistor including (a) means for receiving a signal corresponding to presence or absence of a supply voltage on said low voltage indicator circuit, (b) an emitter coupled to ground and (c) a collector;

an output terminal;

a second transistor having (a) a base coupled to the collector of said first transistor, (b) an emitter coupled to ground and (c) a collector, such that said second transistor is shut off when said first transistor is turned on by the signal corresponding to presence of the supply voltage on said low voltage indicator circuit;

a resistor coupled between the collector of said second transistor and said output terminal;

means, coupled between said output terminal and the base of said second transistor, for providing drive current to the base of said second transistor; and a driver connected to said output terminal and having a control input connected such that current flows through the control input of said driver when said first transistor is turned off by the signal corresponding to absence of the supply voltage on said low voltage indicator circuit.

15. The circuit of claim 14 wherein said means for providing drive current comprises an FET.

16. The circuit of claim 14 wherein said means for providing drive current comprises a resistor.

17. The circuit of claim 14 further comprising a third transistor having an emitter connected to said output terminal, a base connected to said resistor and a collector connected for providing current to the control input of said driver.

18. The circuit of claim 14 wherein said driver comprises a Darlington pair of transistors.

* * * * *